United States Patent
Mitsui

(10) Patent No.: US 6,278,114 B1
(45) Date of Patent: Aug. 21, 2001

(54) METHOD AND APPARATUS FOR MEASURING DIMENSIONS OF A FEATURE OF A SPECIMEN

(75) Inventor: Tadashi Mitsui, Manassas, VA (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/184,074

(22) Filed: Nov. 2, 1998

Related U.S. Application Data

(60) Provisional application No. 60/068,283, filed on Dec. 19, 1997.

(51) Int. Cl.[7] ................................................. H01J 37/26
(52) U.S. Cl. .......................................................... 250/310
(58) Field of Search ................................... 250/310, 311, 250/306, 307, 396 R

(56) References Cited

U.S. PATENT DOCUMENTS

| | | |
|---|---|---|
| 3,715,582 | 2/1973 | Akahori et al. . |
| 3,835,403 | 9/1974 | Leinemann . |
| 3,937,959 | 2/1976 | Namae . |
| 4,097,740 | 6/1978 | Miller et al. . |
| 4,199,681 | 4/1980 | Namae . |
| 4,393,309 | 7/1983 | Norioka . |
| 4,514,634 | 4/1985 | Lawson . |
| 4,724,319 | 2/1988 | Shirota . |
| 4,788,425 | 11/1988 | Kobayashi . |
| 4,978,856 | 12/1990 | Akado . |
| 4,990,776 * | 2/1991 | Fushimi et al. ................... 250/310 |
| 4,999,496 * | 3/1991 | Shaw et al. ........................ 250/310 |
| 5,032,725 | 7/1991 | Kanda . |
| 5,084,618 | 1/1992 | Ito . |
| 5,198,668 | 3/1993 | Yamada . |
| 5,243,191 | 9/1993 | Kobayashi . |
| 5,302,829 | 4/1994 | Komatsu et al. . |
| 5,404,012 | 4/1995 | Yamada . |
| 5,512,747 * | 4/1996 | Maeda ................................. 250/310 |
| 5,594,245 | 1/1997 | Todokoro et al. . |

\* cited by examiner

Primary Examiner—Kiet T. Nguyen
(74) Attorney, Agent, or Firm—Banner & Witcoff, Ltd.

(57) ABSTRACT

An electron microscope for measuring a dimension of a feature of a specimen includes a focusing lens for focusing an electron beam onto the specimen and a supplying circuit for supplying an exciting current supplied to the focusing lens. A control circuit controls the supplying circuit to vary the exciting current which is supplied to the focusing lens and obtains dimension data of a feature of the specimen at each of the exciting currents which is supplied to the focusing lens. An actual dimension of the feature is determined based on the obtained dimension data. Further, a profile of the feature may be determined based on the changes observed in the dimension data.

20 Claims, 8 Drawing Sheets

METHOD AND APPARATUS FOR MEASURING DIMENSIONS OF A FEATURE OF A SPECIMEN

This application claims priority to provisional application No. 60/068,283, filed Dec. 19, 1997.

BACKGROUND OF THE INVENTION

1. Technical Field

The present invention generally relates to a system and method for measuring dimensions of a specimen and, more particularly, to a scanning electron microscope (SEM) for measuring dimensions of a specimen such as a semiconductor wafer.

2. Description of the Related Art

Scanning electron microscopes are widely used to observe the configurations of various types of specimens. In such microscopes, an electron beam is scanned over the surface of the specimen. The electron beam causes electrons on the surface of the specimen to be ejected. These "secondary" electrons are detected and used to generate a picture of the surface either on a screen or in a photograph. Measurements may be determined from the picture and the scale factor of the scanning electron microscope.

To obtain high resolution images of a specimen, the electron beam of the scanning electron microscope must be properly focused. The scanning electron microscope may include a so-called automatic focus (autofocus) feature for obtaining such proper focus. U.S. Pat. No. 5,512,747 to Maeda describes scanning electron microscopes having autofocus features. Referring to FIG. 1(a), an electron beam 1 generated from an electron gun (not shown) is scanned by deflection coils 2X and 2Y and focused into a narrow beam which is irradiated onto a specimen 4. Specimen 4, for example, may be a semiconductor wafer on which semiconductor circuit elements have been or are being formed. Secondary electrons generated from the specimen 4 are detected by a detector 5. By using an electron signal amplified by an amplifier 6 as a brilliance modulation signal for a monitor (not shown) and by synchronizing the signal with scanning by the deflection coils 2X and 2Y, a scanning image of the specimen 4 may be provided on the monitor screen. Stage 15 uses coordinate data from a wafer information register 16 to move the wafer to various measuring points. A focus condition detector 10 uses the absolute value of time differential (or position differential) of the electron signal detected by the detector 5 as an index for evaluating the focus condition. For performing focusing, the exciting current of an objective lens 3 is changed sequentially and gradually by a focus controller 7. Each exciting current makes the electron beam scan on the specimen 4. The intensity of the secondary electron signal obtained at each exciting current is integrated and the absolute value of the signal for a certain scanning period is differentiated by a signal intensity integrator 8. As a result of the above calculation, a focus evaluation value corresponding to each focus condition is obtained as an output from signal intensity integrator 8. It is assumed that the beam is exactly focused when the focus evaluation value reaches a peak value. Accordingly, peak detector 9 detects the peak of the focus evaluation value and an exciting current that makes the focus evaluation value become the peak is sent to the objective lens 3 from focus controller 7, thereby performing focusing. This is also may be referred to as SEM autofocus with an electron beam.

FIG. 1(b) illustrates an arrangement that utilizes a picture processing technique for autofocus. This is an alternative to the SEM autofocus with the electron beam. Using the secondary electron signal from the amplifier 6 as a brilliance modulation signal of a monitor 21, which is scanned in synchronization with the deflection coils 2X and 2Y, an image of the specimen 4 is displayed on the monitor 21. Because the contrast of the picture becomes more intense as the electron beam 1 is focused on the specimen 4 more exactly, the picture signal serves as an index for evaluating the focus when the signals of adjacent picture elements are integrated or differentiated and the sum of their absolute values is calculated. Focus condition detector 10 uses this sum as a focus evaluation value. Picture processor 8 receives the picture signal from the monitor 21 and calculates the focus evaluation value. The peak detector 9 detects the peak of the focus evaluation value and an exciting current that makes the focus evaluation value become the peak is sent to the objective lens 3 from the focus controller 7, thereby performing focusing.

Other variations of SEM autofocus include focusing using optical hardware or static capacity sensors.

In practice, accurate autofocus is difficult to achieve. For example, optical autofocus systems such as the system of FIG. 1(b) are relatively accurate for large patterns, but tend to provide insufficient resolution for highly integrated patterns such as those associated with 256 Mbit DRAMs, for example. Electron beam autofocus systems such as the system of FIG. 1(a) provide better resolution than optical autofocus systems, but are subject to noise. A cause of this noise may include beam charging systems. As described in Chain et al., "Automated CD Measurement with the Hitachi S-6280", SPIE Vol. 2439, pages 319–324, the reliability of automated measurement sequences for measuring critical dimensions (CD) in VLSI manufacturing processes is dependent on various factors including proper focusing. Thus, if an image is out-of-focus due to a failure to accurately autofocus, the measured values of the dimensions of the features of the specimen will differ from the actual value. Further, if the autofocus system fails to operate properly, automated measurements (feature length or width, for example) may be impossible to perform.

Accordingly, it would desirable to provide a system and method for measuring the dimensions of the features of specimens in which the effects of a failure to properly autofocus a scanning electron microscope are eliminated.

SUMMARY OF THE INVENTION

In accordance with one aspect of the present invention, an electron microscope for measuring a dimension of a feature of a specimen includes a focusing lens for focusing an electron beam onto the specimen and a supplying circuit for supplying an exciting current supplied to the focusing lens. A control circuit controls the supplying circuit to vary the exciting current which is supplied to the focusing lens and obtains dimension data of a feature of the specimen at each of the exciting currents which is supplied to the focusing lens. An actual dimension of the feature is determined based on the obtained dimension data.

In accordance with another aspect of the present invention, a method for measuring a feature of a dimension of a specimen using an electron microscope having a focusing lens for focusing an electron beam onto a specimen includes varying an exciting current which is supplied to the focusing lens. Dimension data of a feature of the specimen is obtained at each of the exciting currents which is supplied to the focusing lens. An actual dimension of the feature is then determined based on the obtained dimension data.

In accordance with the present invention, since autofocus is not necessarily needed for the automated measurement of dimensions, effects of autofocus failure can be eliminated. Thus, highly reliable automated critical dimension measurements can be made. Further, the invention may work with both course and fine adjustment systems. In one aspect, the invention may replace the course autofocus systems currently in use.

In accordance with the present invention, the invention may be viewed as separate and apart from standard autofocus techniques. Also, the invention permits CD measurements to be made irrespective of whether the CD measurement tool's autofocus system is working properly in general or is working properly for a given wafer, feature, chip and the like. An advantage of the present invention is that it allows for greater throughput of CD measurements as the invention may be performed quickly while, for example, electron beam autofocus systems may take as long as 10 seconds per focusing operation.

In accordance with the present invention, a method for determining depth or profile of a feature is disclosed.

These and other features of the present invention will be better understood from a reading of the following detailed description in conjunction with the accompanying drawings.

DETAILED DESCRIPTION

The present invention is based on the principle that the reliable measured dimension of an actual dimension of a feature of a specimen can be taken to be the maximum (in the case of features which are openings formed, for example, in one or more layers formed on a semiconductor substrate) or the minimum (in the case of features which are lines such as wirings formed, for example, on a layer formed on a semiconductor substrate) of the dimension values which are obtained by measuring the dimension of the feature using a scanning electron microscope set to a plurality of different objective lens voltages.

Figure 1A:
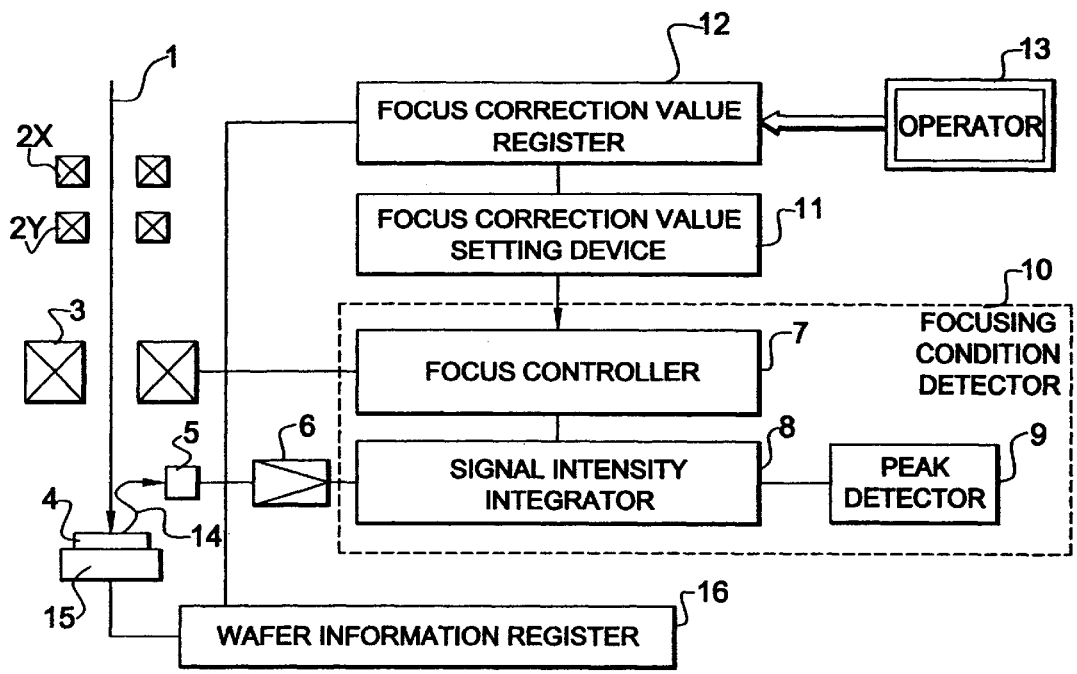
FIG. 1(a) and 1(b) illustrate prior art scanning electron microscopes having autofocus features.
Figure 1B:
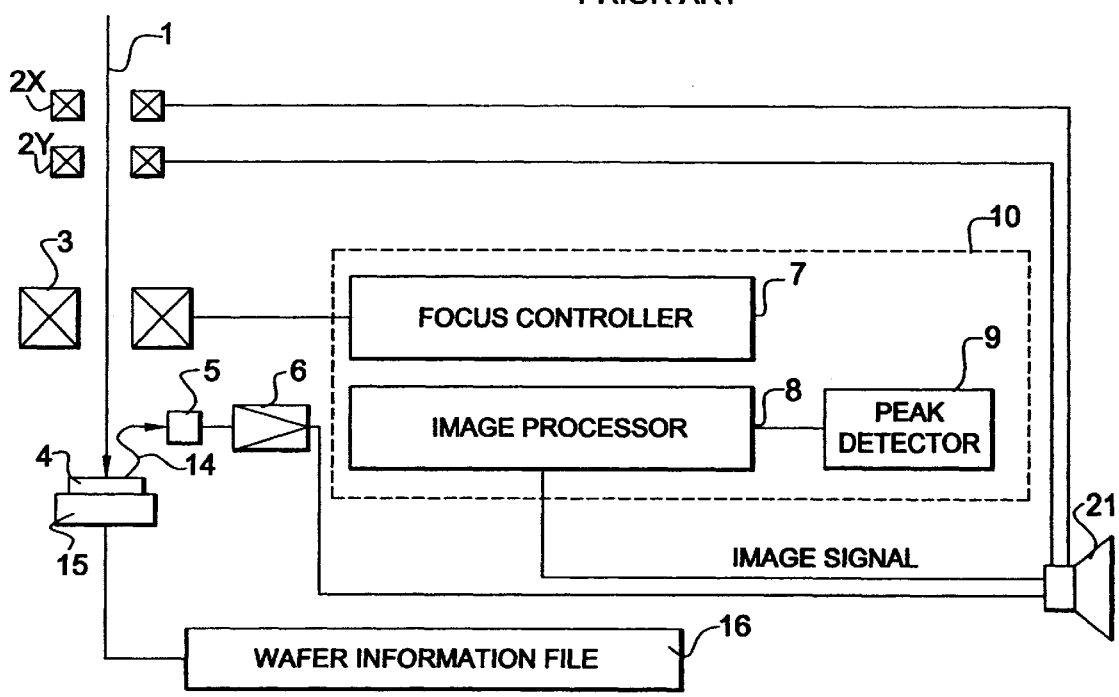
Figure 2A:
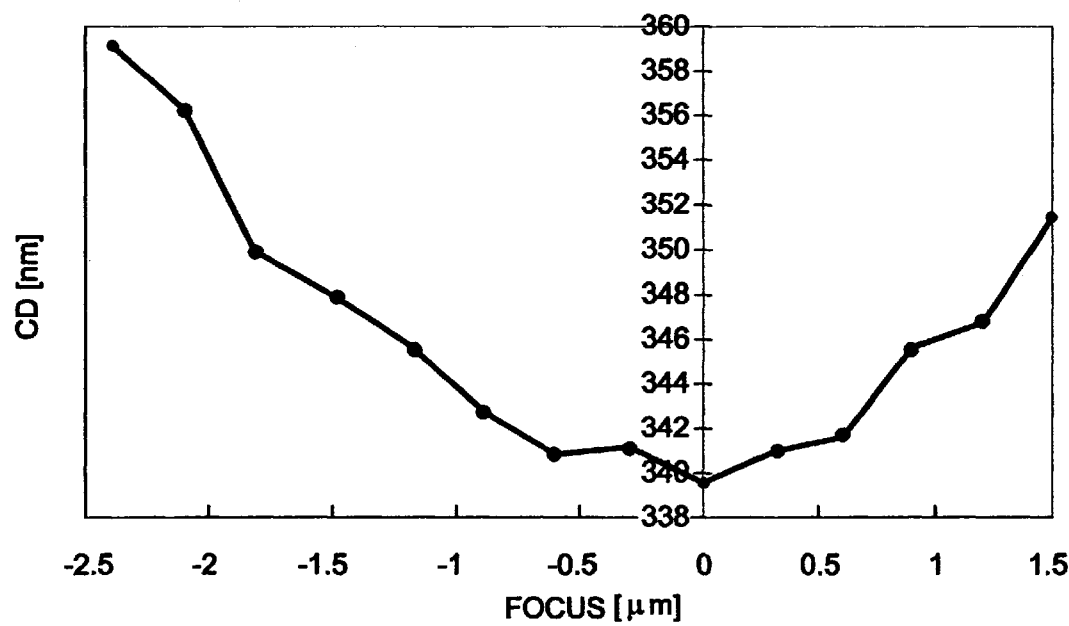
FIGS. 2(a) and 2(b) are graphs illustrating the variation of measured dimensions as a function of focus.

FIG. 2(a) is a graph illustrating the measured dimension (width) of a line (measured in nanometers) as a function of focus (measured in micrometers). The focus is varied by varying the current that is supplied to the objective lens of the scanning electron microscope. As can be seen with reference to FIG. 2(a), the measured dimension of the line varies as the focus is changed. By fitting a curve to the data using, for example, a numerical curve fitting technique, the minimum measurement value can be obtained. This minimum value can be output as the actual dimension of the line. In one example, the relationship between the focus depth and the objective lens voltage may be 1 $\mu$m=1.5×10$^{-3}$ V. If one uses steps of 0.75×10$^{-3}$ V, the focus change between steps may be 0.5 $\mu$m. Looking specifically at FIG. 2(a), the objective lens step voltage is set to 0.45×10$^{-3}$ V resulting in a focus distance step of 0.3 $\mu$m.

Figure 2B:
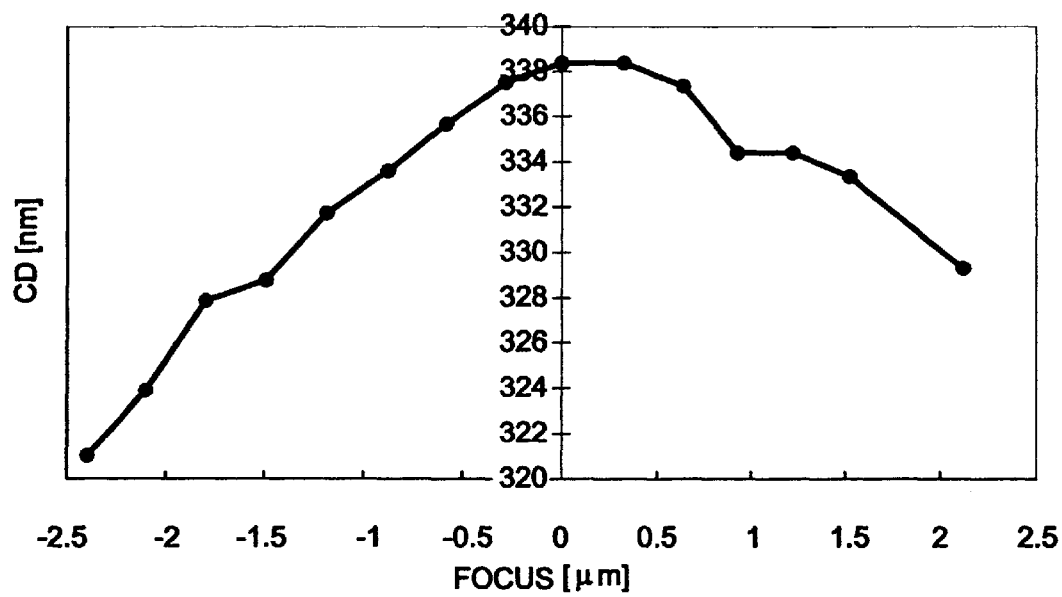

FIG. 2(b) is a graph illustrating the measured dimension (width) of an opening (measured in nanometers) as a function of focus (measured in micrometers). Again, the focus is varied by varying the current which is supplied to the objective lens of the scanning electron microscope. As can be seen with reference to FIG. 2(b), the measured dimension of the opening varies as the focus is changed. By fitting a curve to the data using, for example, a numerical curve fitting technique, the maximum measurement value can be obtained. This maximum value can be output as the actual dimension of the opening.

To obtain the values shown in FIGS. 2(a) and 2(b), a CD SEM, namely a TOPCON MEA2080 mkII, measurement tool may be used when taking measurements from, for example, a 256 Mbit DRAM wafer.

Figure 3:
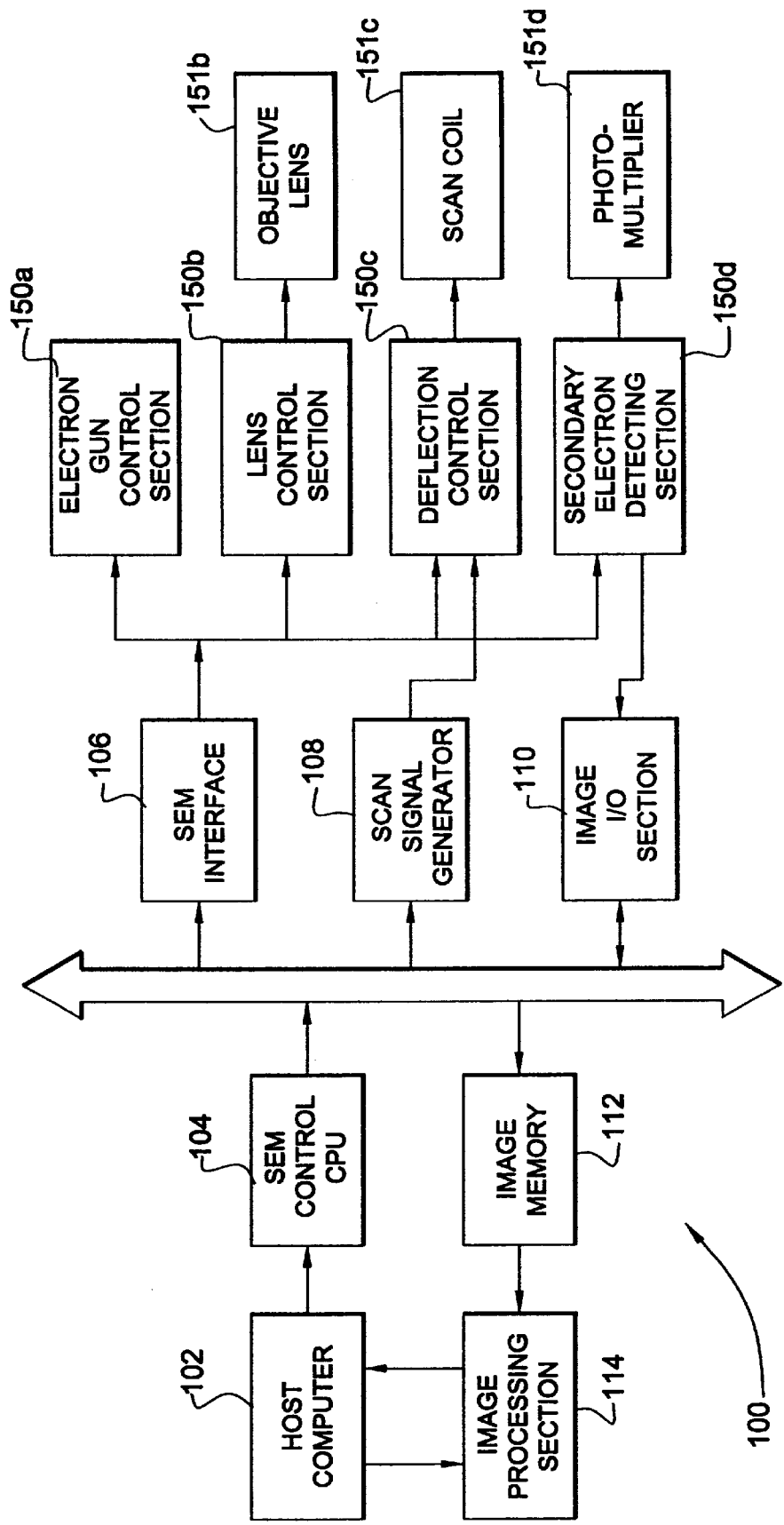
FIG. 3 is a block diagram illustrating a system configuration for implementing the methods of the present invention.

FIG. 3 is a block diagram illustrating a system configuration usable for implementing the methods of the present invention. While the system is described below in terms of a system for measuring the dimensions of features on a semiconductor wafer, the system may also be applied to measuring the dimensions of the features of a display devices such as liquid crystal devices or a CCDs, printed circuit boards, optical discs, metal or polymer materials, cellular tissues, and other living bodies. It should be noted that for deep entities (for example, cellular tissues) the depth of focus needs to be controlled based at least on the layer of interest for CD measurements.

The system 100 includes a scanning electron microscope which includes an electron gun control section 150a, a lens control section 150b, a deflection control system 150c, and a secondary electron detecting section 150d. Beam scanning is effected when an SEM control CPU 104 controls the electron gun control section 150a, the lens control system 150b, and the deflection control section 150c through an SEM interface 106 on the basis of command signals applied from a host computer 102.

For critical dimension measurement, the energy of the beam is less than 1 KeV. That is, electron beams generated through the electron gun control system 150a are deflected by the scan coil 151c, and then irradiated upon the specimen via the objective lens 151b. The beam scanning may be carried out in accordance with a control program executed by a microprocessor of host computer 102 using information contained in a data file for a particular specimen. For example, the data file for a semiconductor wafer which is undergoing processing to form a memory device thereon may contain position information regarding features formed on the semiconductor wafer after particular steps in the processing, e.g., the formation of shallow trenches for isolating the elements of the memory device from one another. The microprocessor of host computer 102 may utilize this position information to appropriately scan the electron beam so that measurements of the dimensions of such features may be obtained. A scanning signal generator 108 generates scanning control signals on the basis of data supplied from host computer 102.

Secondary electron signals obtained from the object due to the beam scanning is, via a photomultiplier 151d, detected by the secondary electron detecting system 150d. The detected secondary electron signals are converted into video signals by an image input and output section 110, and then stored in an image memory 112. The video signals stored in image memory 112 are processed by an image processing section 114.

Figure 4:
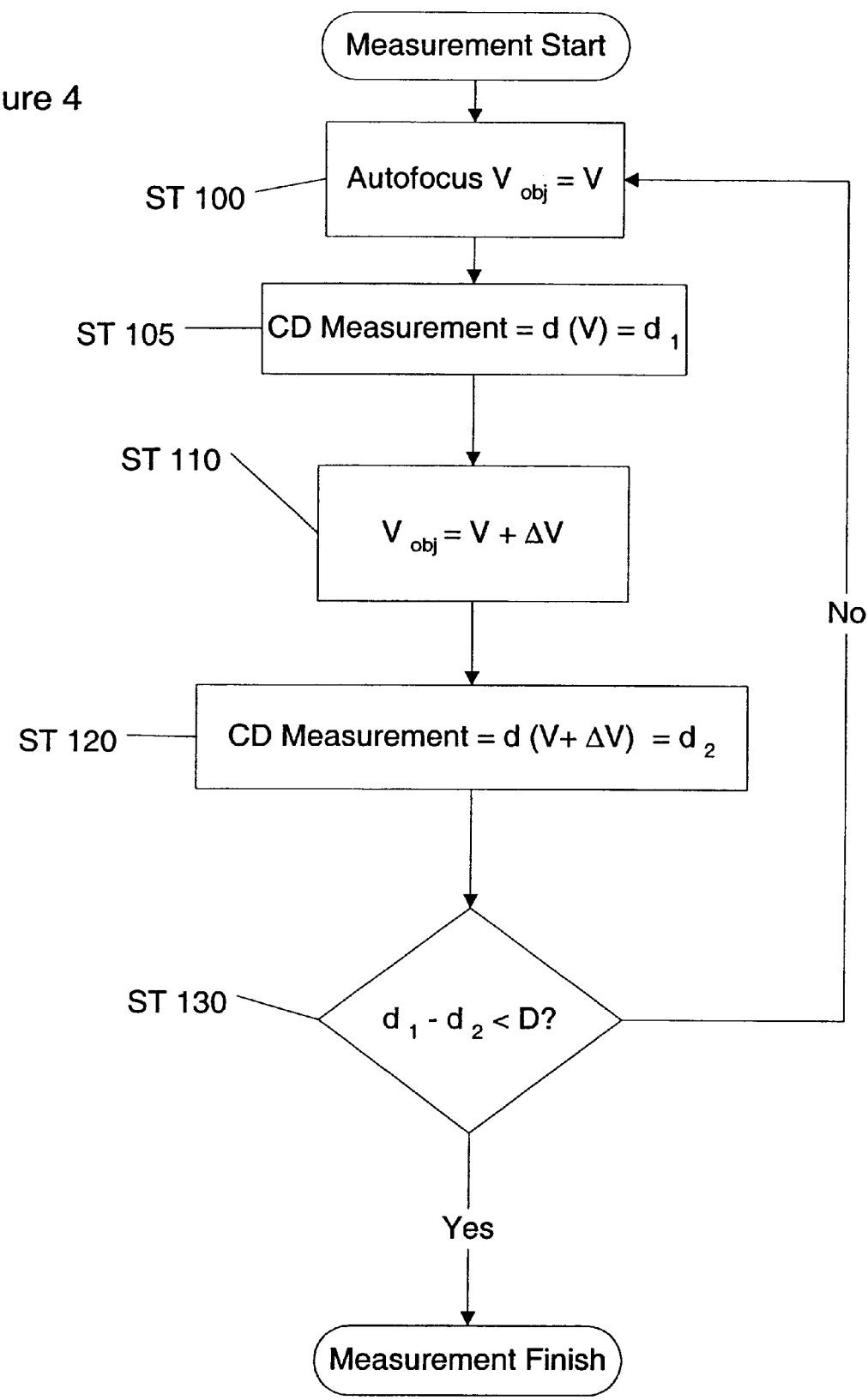
FIG. 4 is a flow chart illustrating a method in accordance with a first embodiment of the present invention.

In accordance with a first method of the invention, a pattern focus verification method is shown in FIG. 4. At step ST 100, the autofocus voltage $V_{obj}$ is set to a voltage V. Next, a critical dimension (CD) measurement is taken at voltage V, with the result stored as $d_1$ in step ST 105 (as $d(V)=d_1$). The voltage of the objective lens $V_{obj}$ is increased by $\Delta V$ in step ST 110, where $V_{obj}$ is set equal to $(V+\Delta V)$. Another critical dimension (CD) measurement is taken at the new voltage of the objective lens voltage as $d(V+\Delta V)$ as stored as $d_2$ in step ST 120. The difference between the first and second measurements is compared to predetermined constant parameter D in step ST 130. If the difference between the two measurements is below a threshold established by parameter D, then the method ends. If, however, the difference is greater than predetermined difference D, then the autofocus step of ST 100 is repeated until the difference $(d_1-d_2)$ is less than predetermined distance D. In this regard, verification of a system's autofocusing capabilities may be performed.

Figure 5:
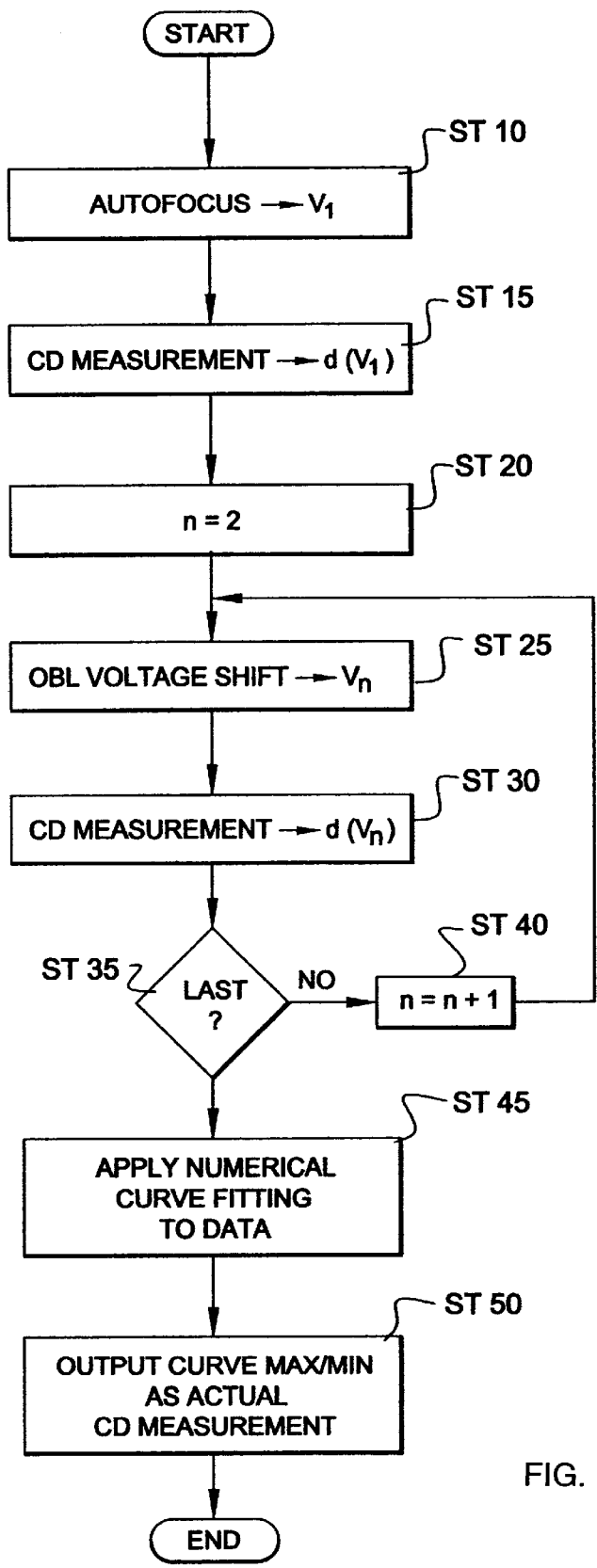
FIG. 5 is a flow chart illustrating a method in accordance with a second embodiment of the present invention.

In accordance with a second method of the present invention, an objective lens voltage-critical dimension curve fitting method as set forth in the flowchart of FIG. 5 is utilized. In the method of FIG. 5, a normal autofocus procedure is carried out at ST 10 to obtain an objective lens voltage $V_1$. This autofocus procedure may be any conventional optical autofocus method, electron beam autofocus method, or capacitance sensor (Z sensor) method. Alternatively, a preset objective lens voltage $V_1$ may be used and the autofocus procedure may be omitted. At ST 15, a critical dimension measurement $d(V_1)$ is carried out at the objective lens voltage $V_1$. A counter n is then set to 2 at step ST 20 and the objective lens voltage is then shifted to a voltage $V_n$ where n is equal to 2 at step ST 25. The objective lens voltage, which is determined in step ST 10 may be used as the center value.

The end points of the voltage levels may be picked by using knowledge of the working distance between the objective lens and the sample to be illuminated, which then suggests the end points to be used. For example, a working distance of 0.6 mm to 1.0 mm may be used to generate the endpoints used in FIGS. 2(a) and 2(b) above. However, it should be noted that the selection of the working distance is dependable on the measuring tool used, and the end points should be adjusted accordingly.

The starting voltage for the objective lens voltage $V_n$ also needs to be selected. At least three methods exist for selecting the initial objective lens voltage $V_n$. First, a starting voltage may be selected at random. Second, a voltage may be selected based on a similar starting voltage for all wafers. Third, the tool used for taking measurements may have a default voltage setting.

The steps may be uniform and set to a minimum step dimension allowable by the routine. A critical dimension measurement $d(V_n)$ is carried out at the objective lens voltage $V_n$ at ST 30. If there are other voltages to be applied to the objective lens at ST 35, n is set equal to n+1 at ST 40 and control returns to step 25. If there are no other voltages to be applied to the objective lens at ST 35, a numerical curve fitting technique is applied the data at ST 45. The maximum (or minimum) value of the numerically generated curve is determined to be the actual critical dimension (CD) value and is output at ST 50.

Figure 6:
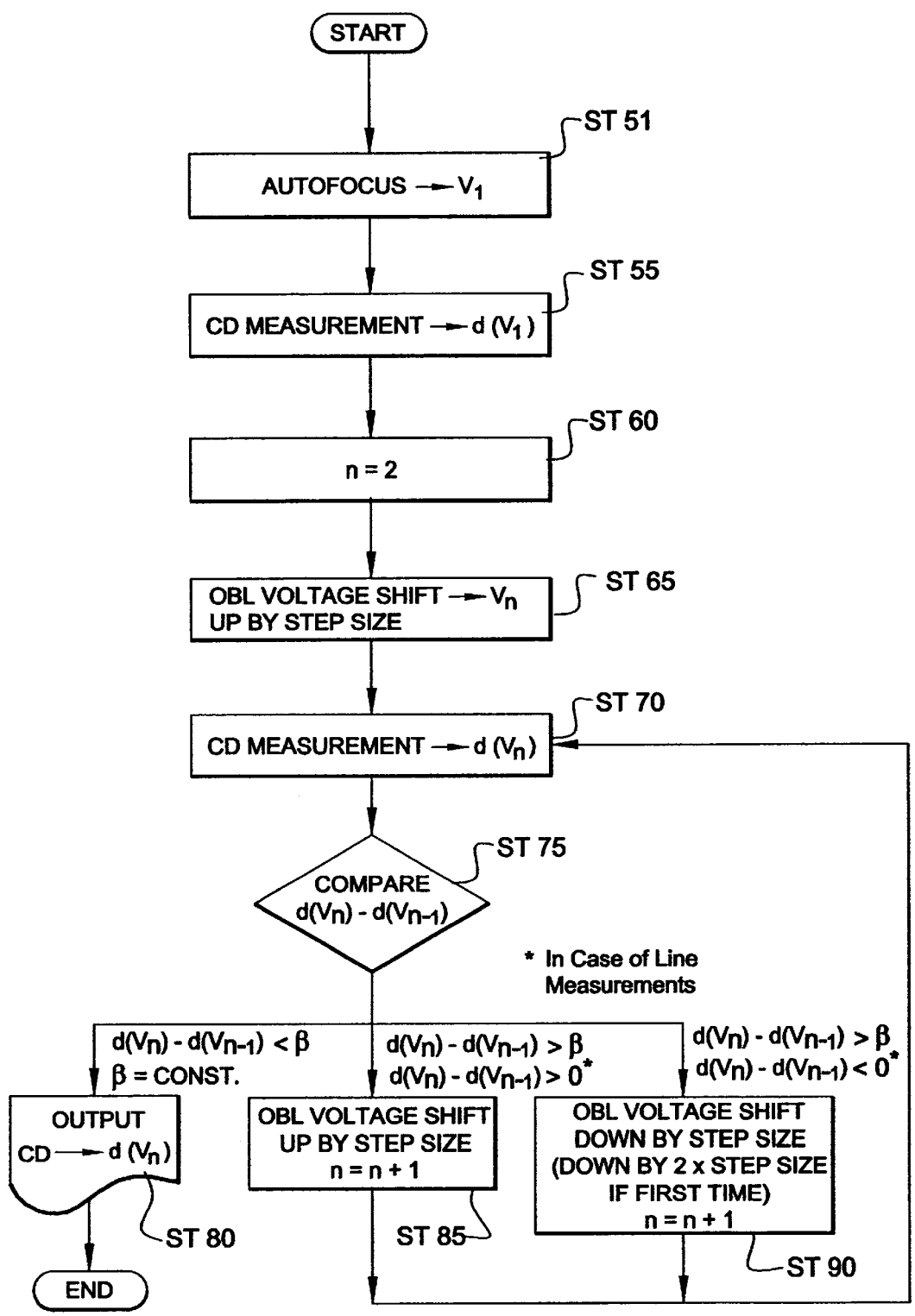
FIG. 6 is a flow chart illustrating a method in accordance with a third embodiment of the present invention.

In accordance with a third method of the present invention, a hill climb method as shown in FIG. 6 is utilized. In the method of FIG. 6, a normal autofocus procedure is carried out at ST 51 to determine an initial objective lens voltage $V_1$. This autofocus procedure may be any conventional optical autofocus method, electron beam autofocus method, or capacitance sensor (Z sensor) method for determining an objective lens voltage $V_n$. Alternatively, a pre-set objective lens voltage $V_1$ may be used and the autofocus procedure may be omitted. At ST 55, a critical dimension (CD) measurement $d(V_1)$ is made at the objective lens voltage $V_1$. At ST 60, a counter n is incremented to 2 and the objective lens voltage is then shifted to a voltage $V_n$ at step 65. A critical dimension (CD) measurement $d(V_n)$ is then made at the objective lens voltage $V_n$(ST 70). The measurements $d(V_n)$ and $d(V_{n-1})$ are then compared at ST 75. If $d(V_n)-d(V_{n-1})$ is less than a predetermined constant parameter $\beta$, the critical dimension $d(V_n)$ is output at ST 80 as the measured critical dimension and the measurement process is ended. In the case of a line measurement, if $d(V_n)-d(V_{n-1})$ is greater than a predetermined constant parameter $\beta$ and $d(V_n)-d(V_{n-1})$ is less than 0, the objective lens voltage is increased in accordance with the step size at ST 85, n is incremented to n+1, and the critical dimension measurement process of ST 65 is repeated.

In the case of a line measurement, if $d(V_n)-d(V_{n-1})$ is greater than a predetermined constant parameter $\beta$ and $d(V_n)-d(V_{n-1})$ is greater than 0, the objective lens voltage is stepped down at ST 90 by the step size, n is incremented to n+1, and the critical dimension measurement process of ST 65 is repeated. So as to ensure that a good starting point has been chosen, the first time ST 90 is implemented, the objective lens voltage is stepped down by twice the step size. To this end, subsequent stepping downs of the objective lens voltage at ST 90 are at the step size. This process is repeated until the determined critical dimension measurements become stable, i.e., until $d(V_n)-d(V_{-1})$ is less than a predetermined constant parameter $\beta$.

It should be noted that FIG. 6 is described in relation to determining line widths (see, for example, FIG. 2(a)). In the case of determine a space width, a similar procedure is used, however, instead of the objective lens voltage being stepped up in ST 85, it is stepped down. Likewise, in ST 90, instead of the objective lens voltage being stepped down, it is stepped up.

In the above examples, predetermined constant parameter $\beta$ may be selected so as to enable the correct objective lens voltage to be determined. For example, constant parameter $\beta$ may be set to 3 nm during a first pass. The next round, the constant parameter $\beta$ may be set to 1 nm during a second and subsequent passes so as to perform finer adjustments on the focusing of the CD SEM. In this regard, the objective voltage step size may be decreased as well so as to more precisely determine a desired objective lens voltage.

Figure 7A:
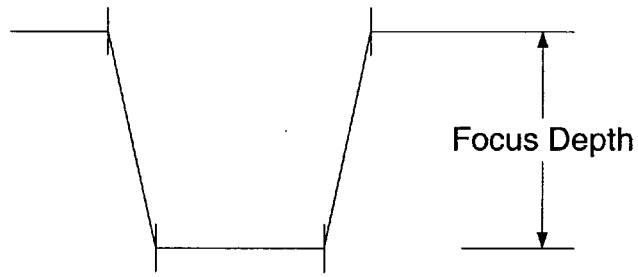
FIGS. 7(a) and 7(b) illustrate a trench being measured in accordance with the present invention.

Feature height may also be measured in accordance with the present invention. FIG. 7(a) shows an example of a trench illustrating how focus depth is related to feature height (or depth). Here, the trench has approximately two focal regions: one at the top of the trench and the second at the bottom of the trench. FIG. 2(b) may be considered to include a focal determination at the two surfaces. At one of the surfaces, e.g., the bottom of the trench or the top surface of the trench, the graph representing the change in critical dimension measurements becomes flat. To the right side of the central peak, the slope of the graph nears zero again the proceeds to become negative again. The two portions where the slopes of the graph approached zero may be considered to be the two focusing surfaces. In that the objective lens voltage is related to working distance, the distance (horizontal on FIG. 2(b)) between the two flat portions may be considered to be the distance between the two surfaces. For the space of FIG. 2(b), the depth of the space may then be estimated at 0.9 micrometers. One of ordinary skill in the art will recognize that determining the height of a line may be performed as well using the disclosed process as well.

Figure 7B:
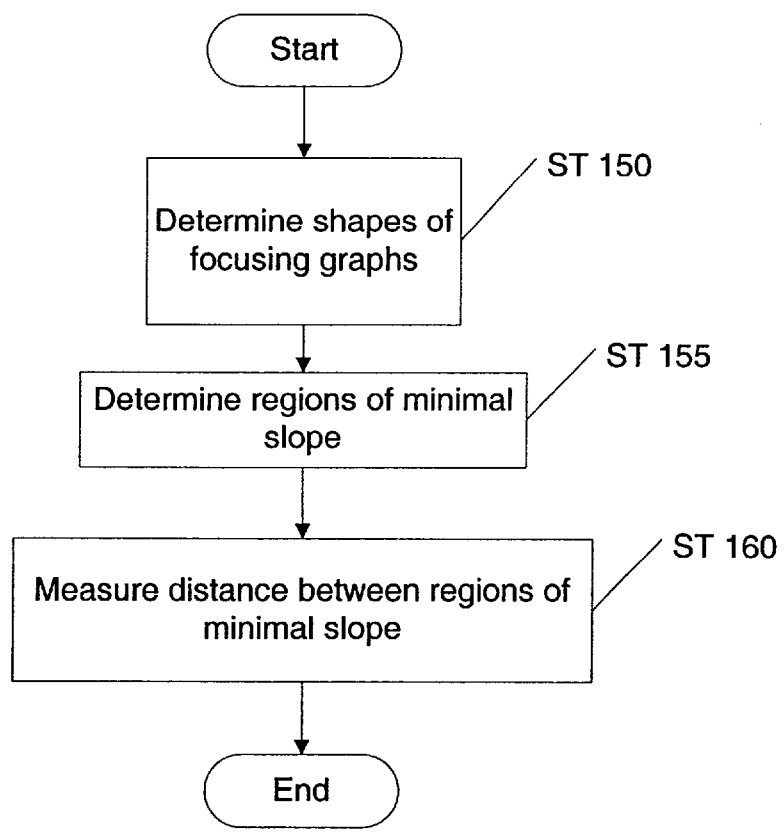

FIG. 7(b) is a flowchart of how, for example, the depth is determined. In step ST 150, the shapes of the focusing graphs (for example, from FIGS. 2(a) and 2(b)) are determined. In step ST 155, the regions of minimal slope are determined. In step 160, the distance between the regions of minimal slope is measured. Accordingly, using this method, one may determine line height or space depth using a non-destructive measuring technique, e.g., one that allows for optical determination of depth rather than destructively cutting a chip to determine feature height or depth.

Figure 8A:
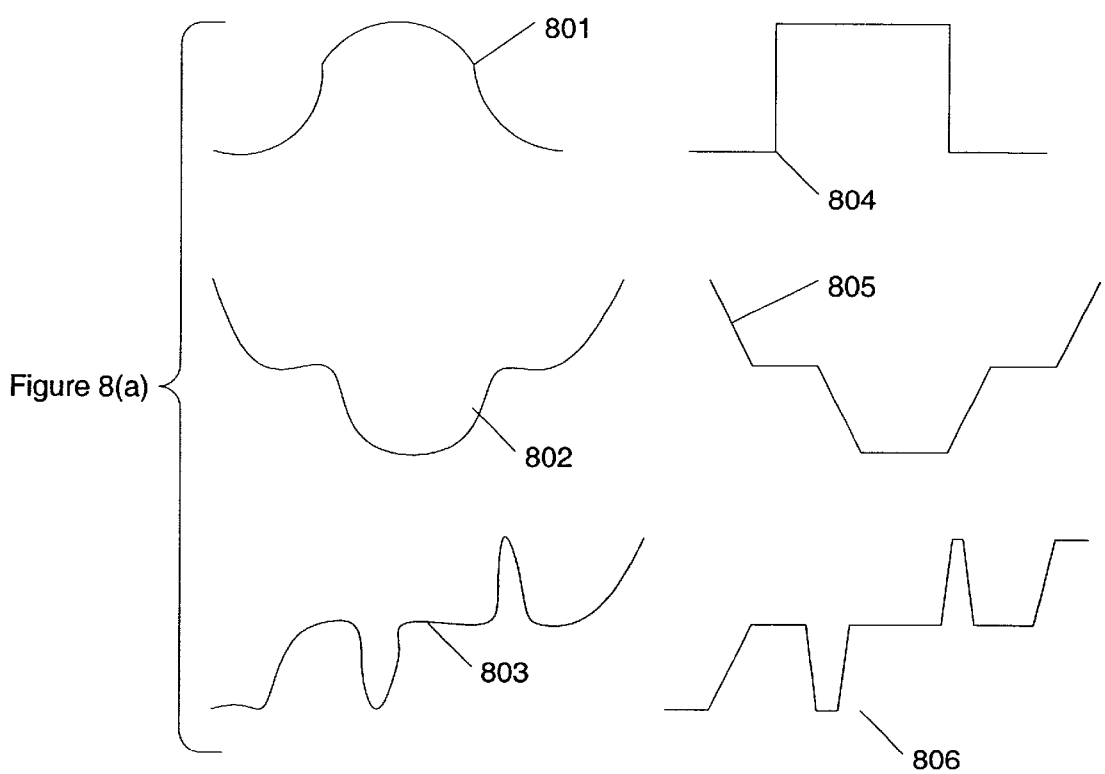
FIGS. 8(a) and 8(b) illustrate features and related focusing methods measuring degrees of roughness in accordance with the present invention.
Figure 8B:
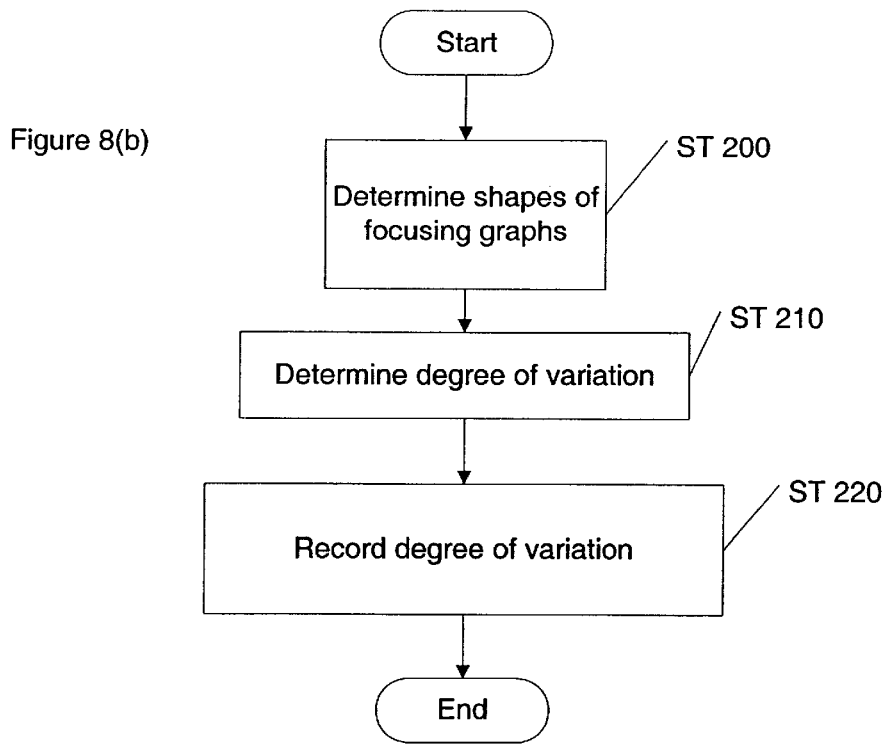

FIGS. 8(a) and 8(b) relate to determining the roughness of the feature being measured. FIG. 8(a) shows two feature profiles: a profile with gentle sloping sides 801 and a profile with sharp sides 804. A focusing graph 802, 805 (respectively) is made of each using the techniques described above in step ST 200 of FIG. 8(b). Next, the shapes of the respective graphs 802, 805 are analyzed ST 210 to determine the degree of variation of, for example, the slopes of the resulting graphs. ST 210 may include determining a derivative of the graphs, taking a statistical sampling of the change between focus voltage values, and the like. This change in variation is then recorded. As the change in variation is related to the profile of the underlying feature, the sharpness of the feature may be analyzed using this non-destructive analysis, e.g., determining how images resolve under varying focal depths. In one example, the derivatives of lines 802 and 805 are taken. The resulting graphs 803 and 806 show the rate of change of the slopes of graphs 802 and 805. As the graphs suggest, gentle curving profiles result in softer curves like that of graph 803 while sharp edges in a profile result in a more discrete slope levels, as shown in graph 806. Finally, the degree of variation may be recorded in step ST 220. This analysis of the profile, for example, may allow a process to be adjusted to create a desired profile. For instance, sharp corners of a feature may be smoothed to reduce the chances of an overlying metal layer necking then later breaking. Similarly, soft corners of a feature may be sharpened with the newly available data so as to allow for cleaner implants in areas of interest, for example.

In accordance with the present invention, the effects of autofocus failure on precise critical dimension measurements can be eliminated. Thus, highly reliable automated critical dimension measurements can be made.

While the invention has been described in detail with reference to the appended drawings, the invention is limited in scope only by the claims. Moreover, any patent or publication cited herein should be construed to be incorporated by reference as to any subject matter deemed essential to the present disclosure.

I claim:

1. An electron microscope for measuring a dimension of a feature of a specimen, comprising:

a focusing lens for focusing an electron beam onto the specimen;

a supplying circuit for supplying an exciting current supplied to said focusing lens; and a control circuit for controlling said supplying circuit to vary the exciting current which is supplied to said focusing lens, for obtaining dimension data of a feature of the specimen at each of the exciting currents which is supplied to said focusing lens, and for determining an actual dimension of the feature based on the obtained dimension data.

2. The electron microscope according to claim 1, wherein said control circuit includes a curve fitting means for fitting a curve to the dimension data as a function of focusing lens voltage.

3. The electron microscope according to claim 2, wherein said control circuit determines the actual dimension based on a maximum/minimum of the curve.

4. The electron microscope according to claim 1, wherein said control circuit increases or decreases the exciting current supplied to said focusing lens in a series of steps until the dimension data obtained at the most recent step differs from the dimension data obtained at a previous step by less than a predetermined amount.

5. The electron microscope according to claim 4, wherein said control circuit outputs the dimension data obtained at the most recent step as the actual dimension data.

6. A method for measuring a dimension of a feature of a specimen using an electron microscope having a focusing lens for focusing an electron beam onto a specimen, the method comprising the steps of:

varying an exciting current which is supplied to said focusing lens;

obtaining dimension data of a feature of the specimen at each of the exciting currents which is supplied to said focusing lens; and determining an actual dimension based on the dimension data.

7. The method according to claim 6, comprising the further step of fitting a curve to the dimension data as a function of focusing lens voltage, wherein the actual dimension is determined based on a maximum/minimum of the curve.

8. The method according to claim 6, comprising the further steps of:

comparing first dimension data obtained at a first focusing lens voltage with second dimension data obtained at a second focusing lens voltage;

increasing or decreasing the first focusing lens voltage value if the first dimension data differs from the second dimension data by more than a predetermined amount.

9. The method according to claim 8, comprising the further step of:

outputting the first dimension data as the actual dimension data if the first dimension data differs from the second dimension data by less than the predetermined amount.

10. The method according to claim 6, wherein the specimen comprises a semiconductor wafer.

11. A method for measuring a height of a feature of a specimen using an electron microscope having a focusing lens for focusing an electron beam onto a specimen, the method comprising the steps of:

varying an exciting current which is supplied to said focusing lens;

obtaining dimension data of a feature of the specimen at each of the exciting currents which is supplied to said focusing lens;

determining the rate of change of the dimension data; and determining the height of a feature based on the rate of change of the dimension data.

12. The method according to claim 11, comprising the further step of fitting a curve to the dimension data as a function of focusing lens voltage, wherein the height of the feature is determined based on at least one maximum/minimum of the curve.

13. The method according to claim 11, comprising the further steps of:

comparing first dimension data obtained at a first focusing lens voltage with second dimension data obtained at a second focusing lens voltage;

increasing or decreasing the first focusing lens voltage value if the first dimension data differs from the second dimension data by more than a predetermined amount.

14. The method according to claim 13, comprising the further step of:

outputting the first dimension data as the actual dimension data if the first dimension data differs from the second dimension data by less than the predetermined amount.

15. The method according to claim 11, wherein the specimen comprises a semiconductor wafer.

16. A method for measuring a profile of a feature of a specimen using an electron microscope having a focusing lens for focusing an electron beam onto a specimen, the method comprising the steps of:

varying an exciting current which is supplied to said focusing lens;

obtaining dimension data of a feature of the specimen at each of the exciting currents which is supplied to said focusing lens;

determining the rate of change of the dimension data; and determining the variation in the rate of change.

17. The method according to claim 16, comprising the further steps of:

comparing first dimension data obtained at a first focusing lens voltage with second dimension data obtained at a second focusing lens voltage;

increasing or decreasing the first focusing lens voltage value if the first dimension data differs from the second dimension data by more than a predetermined amount.

18. The method according to claim 17, comprising the further step of:

outputting the first dimension data as the actual dimension data if the first dimension data differs from the second dimension data by less than the predetermined amount.

19. The method according to claim 16, wherein the specimen comprises a semiconductor wafer.

20. A method for measuring a profile of a feature of a specimen, the method comprising the steps of:

varying an exciting current supplied to a focusing lens;

obtaining dimension data of a feature of the specimen at each of the exciting currents which is supplied to said focusing lens;

determining the rate of change of the dimension data; and determining the profile of the feature based on the rate of change of the dimension data.

* * * * *